United States Patent [19]

Nagata et al.

[11] Patent Number: 5,550,101

[45] Date of Patent: Aug. 27, 1996

[54] SUPERCONDUCTING MAGNETORESISTIVE ELEMENT HAVING A PLURALITY OF WEAK-COUPLING PORTIONS AND A METHOD OF FABRICATING THE SAME

[75] Inventors: Masaya Nagata, Souraku-gun; Hideo Nojima; Masayoshi Koba, both of Nara, all of Japan

[73] Assignee: Sharp Kabushiki Kaisha, Osaka, Japan

[21] Appl. No.: 302,390

[22] Filed: Sep. 8, 1994

Related U.S. Application Data

[63] Continuation of Ser. No. 968,681, Oct. 30, 1992, abandoned.

[30] Foreign Application Priority Data

Oct. 31, 1991 [JP] Japan ..................... 3-286178

[51] Int. Cl.⁶ .................................... H01L 39/22
[52] U.S. Cl. ................. 505/162; 505/329; 216/3
[58] Field of Search ............... 251/31, 34; 324/248, 324/252; 505/162, 329; 216/3

[56] References Cited

U.S. PATENT DOCUMENTS

| | | | |
|---|---|---|---|
| 4,025,844 | 5/1977 | Deutscher | 257/32 |
| 5,026,682 | 6/1991 | Clark et al. | 505/162 |
| 5,162,298 | 11/1992 | Chaudhari et al. | 505/162 |

FOREIGN PATENT DOCUMENTS

| | | |
|---|---|---|
| 0364101 | 4/1990 | European Pat. Off. . |
| 0381541 | 8/1990 | European Pat. Off. . |
| 2264486 | 10/1990 | Japan . |
| 3234071 | 10/1991 | Japan . |

OTHER PUBLICATIONS

Nojima et al., "Improvement in Sensitivity of Novel Magnetic Sensor Using Y–Ba–Cu–O Ceramic Superconductor Film", IEDM, Dec. 1988, pp. 892–893.

Gross et al., "Characteristics of $YBa_2Cu_3O_{7-\delta}$ Grain Boundary Junction DC–Squids" IEEE Trans. on May. vol. 27, No. 2, Mar. 1991, pp. 2565–2568.

Fundamental Characteristics of a Magnetoresistive Sensor Using $Y_1Ba_2Cu_3O_{7-x}$ Ceramic Superconducting Films to Hideo Nojima et al, IEEE Transactions on Electron Devices, vol. 39, No. 3, Mar. 1992.

*Primary Examiner*—Thi Dang

[57] ABSTRACT

A superconducting magnetoresistive element has superconducting portions having a high critical current density and weak-coupling portions having a low critical current density. The superconducting portions and weak-coupling portions are alternately arranged and connected in series. The superconducting magnetoresistive element is fabricated, for example, by forming semiconductor films at a plurality of sites on a substrate in a manner that the semiconductor films are spaced from each other, then forming a superconducting thin film all over the substrate and processing the superconducting thin film into a line pattern which passes over the plurality of semiconductor films, and heat-treating the substrate to diffuse a constituent element of the semiconductor films in the superconducting thin film. Portions of the superconducting thin film overlying the semiconductor films become the weak-coupling portions and the rest portions of the superconducting thin film become the superconducting portions.

7 Claims, 8 Drawing Sheets

SUPERCONDUCTING MAGNETORESISTIVE ELEMENT HAVING A PLURALITY OF WEAK-COUPLING PORTIONS AND A METHOD OF FABRICATING THE SAME

This application is a continuation of application Ser. No. 07/968,681 filed on Oct. 30, 1992, now abandoned.

BACKGROUND OF THE INVENTION

1. Field of the Invention

The present invention relates to a superconducting magnetoresistive element made from a superconducting material having weak couplings at grain boundaries, and a method of fabricating the same.

2. Description of the Prior Art

Figure 8:
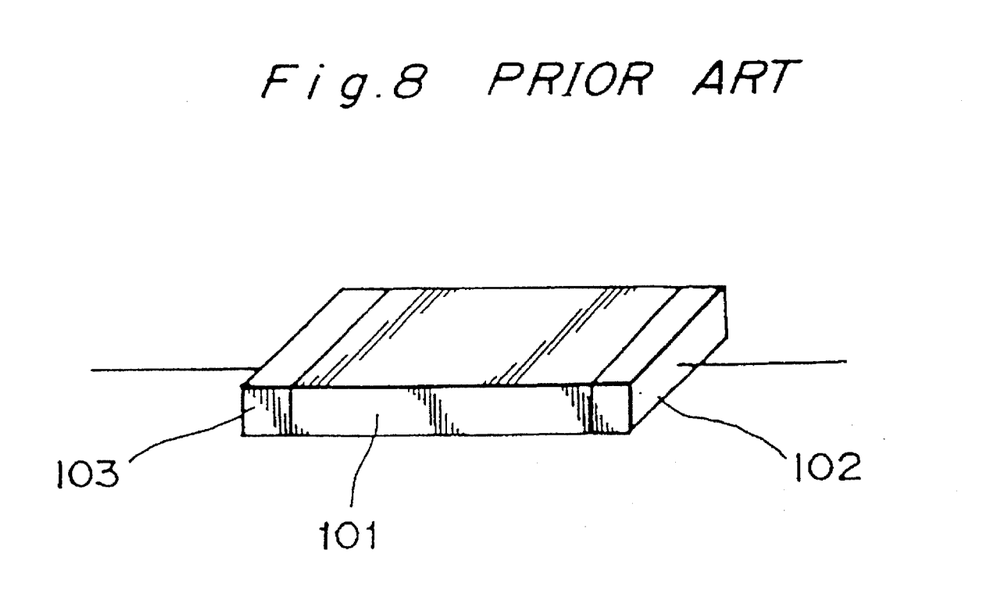
FIG. 8 is a schematic view showing the construction of the conventional superconducting magnetoresistive element.

FIG. 8 shows a conventional superconducting magnetoresistive element of the above-mentioned type. This superconducting magnetoresistive element has a $Y_1Ba_2Cu_3O_{7-x}$ superconducting body 101 having weak couplings at grain boundaries, namely, equivalents of Josephson junctions. At both ends of the superconducting body 101, electrodes 102 and 103 are provided. The superconducting body 101 is fabricated as follows. After a mixture of the starting powders is calcined at 900° C., the product is pulverized and remixed. The powders remixed are pressed into a thin plate and the thin plate is finally calcined at 1000° C., becoming the superconducting body having the weak couplings.

Figure 7:
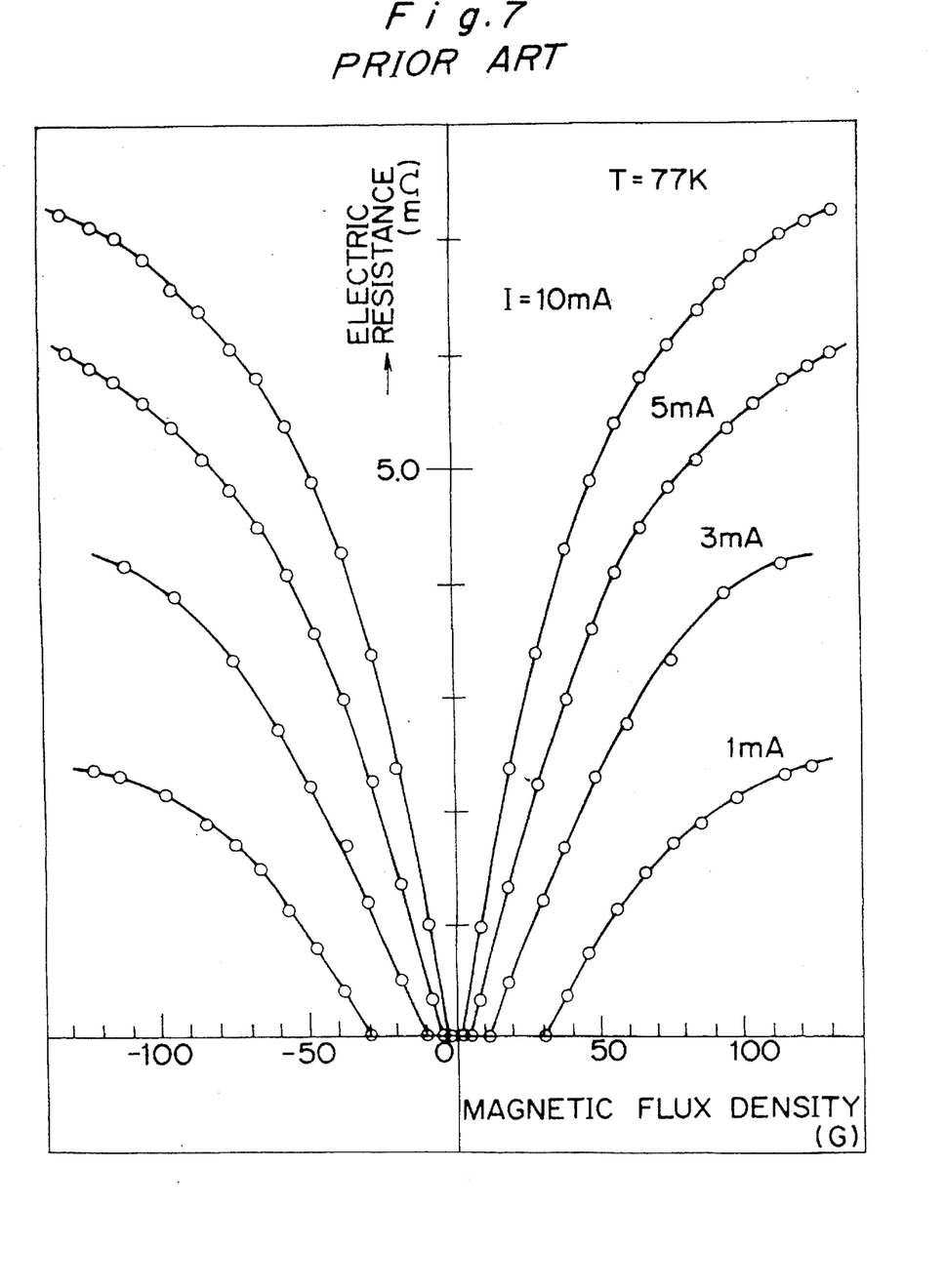
FIG. 7 is a graph showing the magnetoresistive characteristic of the conventional superconducting magnetoresistive element.

FIG. 7 shows a magnetoresistive characteristic of the superconducting magnetoresistive element of FIG. 8. As understood from the graph of FIG. 7, the superconducting magnetoresistive element yields a breakage of the superconductivity of weak couplings at an extremely weak magnetic field (a few gausses), allowing an electric resistance to appear, and the electric resistance abruptly increases with increasing strength of the applied magnetic field. Therefore, the superconducting magnetoresistive element has high sensitivities at weak magnetic fields, as compared with semiconductor magnetoresistive elements.

However, the conventional superconducting magnetoresistive element has the following problem. Since the element has only a single superconducting body 101 wherein the weak couplings or Josephson junctions are disorderly arranged, a loud noise is generated, so that the S/N (signal-to-noise) ratio is low.

The superconducting body having weak couplings at grain boundaries has a low critical current density. It is known that a higher S/N (signal-to-noise) ratio can be offered if a plurality of portions having a low critical current density (referred to as weak-coupling portions hereinbelow) like the superconducting body 101 are provided in a manner to alternate with a plurality of superconducting portions which have such a high critical current density that they hold a zero electric resistance to any strengths of magnetic field within a measuring range, so that those weak-coupling and superconducting portions are connected in series. But, since the conventional fabrication method includes the calcining steps, it is extremely difficult to obtain such an alternate arrangement of the weak-coupling portions having a low critical current density and the superconducting portions having a high critical current density. As a result, with the conventional fabrication method, it is impossible to increase the S/N ratio of the superconducting magnetoresistive element.

SUMMARY OF THE INVENTION

The present invention has been developed with a view to substantially solving the above described disadvantages and has for its essential object to provide a superconducting magnetoresistive element which offers a high S/N ratio and also provide a method of fabricating such elements without a calcining step.

In order to achieve the aforementioned object, the present invention provides a superconducting magnetoresistive element which comprises a plurality of superconducting portions having such a high critical current density that the superconducting portions hold a zero resistance to any magnetic fields within a measuring range, said superconducting portions being spaced from each other; and a plurality of weak-coupling portions having a low critical current density, each of which is positioned between the neighboring superconducting portions so that the superconducting portions and the weak-coupling portions are alternately arranged and connected in series.

Since the superconducting magnetoresistive element of the present invention has a plurality of weak-coupling portions, it has an improved sensitivity and an increased S/N ratio.

It is to be noted that in this specification the term "weak-coupling portion" is defined as a portion which contains weak-couplings at the grain boundary regions in a superconducting substance, i.e., equivalents of Josephson junctions, and has a low critical current density.

The superconducting magnetoresistive element is fabricated in various ways. For example, first, either semiconductor films or metal films are formed at a plurality of sites on a substrate in a manner that the semiconductor or metal films are spaced from each other. Then, a superconducting thin film is formed all over said substrate and processed into a line pattern which passes over the plurality of semiconductor or metal films. Then, the substrate is treated with heat to diffuse a constituent element of the semiconductor films or metal films in the superconducting thin film. Portions of the superconducting thin film overlying the semiconductor or metal films become the weak-coupling portions and the rest portions of the superconducting thin film become the superconducting portions.

In another fabricating method, a superconducting thin film is first formed all over a substrate and processed into a line pattern. Then, a resist pattern is formed on the substrate by photolithography so that the superconducting thin film of the line pattern is covered by the resist pattern at a plurality of sites spaced each other in a lengthwise direction of the superconducting thin film. Then, a specified element is doped to the superconducting thin film by an ion-implantation method, using the resist pattern as a mask. Consequently portions of the superconducting thin film not masked by the resist pattern become the weak-coupling portions and the rest portions of the superconducting thin film masked by the resist pattern become the superconducting portions.

The above two methods dope a specified element to a superconducting thin film to attain the weak-coupling portions. However, difference of crystal orientation can be utilized as in the following methods.

Ground films are first formed at a plurality of sites on a substrate surface in a manner that the ground films are spaced from each other. These ground films are capable of changing a crystal orientation of a superconducting thin film to be formed thereon. Then, the superconducting thin film is formed all over the substrate and processed into a line pattern which passes over the plurality of ground films. Portions of the superconducting thin film overlying either the substrate or the ground films become the weak-coupling portions and portions of the superconducting thin film other than the weak-coupling portions become the superconducting portions.

The following method is also applicable. In the method, a substrate is provided which has a staircase shape surface consisting of a plurality of first crystal planes and a plurality of second crystal planes crossing and alternating with the first crystal planes, said second crystal planes being capable of changing a crystal orientation of a superconducting thin film to be formed thereon. The superconducting thin film is formed all over the staircase-shaped surface of the substrate and processed into a line pattern which passes over the plurality of second crystal planes. Consequently, portions of the superconducting thin film being in contact with either the first crystal planes or the second crystal planes become the weak-coupling portions and portions of the superconducting thin film other than the weak-coupling portions become the superconducting portions.

Any of the above methods can advantageously control the number of the weak-coupling portions with ease.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

First Embodiment

Figure 1:
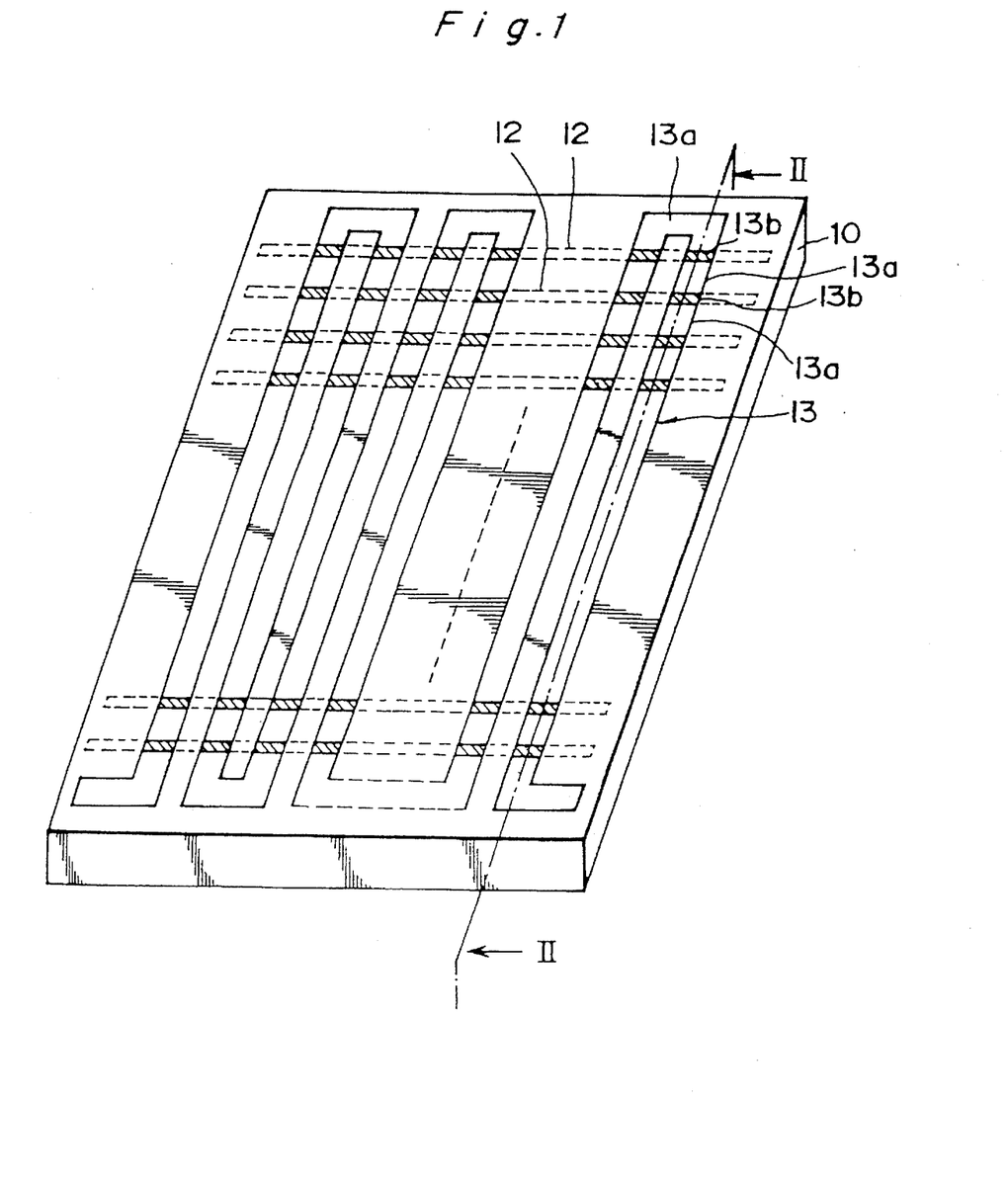
FIG. 1 is a schematic view showing the construction of a superconducting magnetoresistive element according to a first embodiment of the present invention.

FIG. 1 shows the construction of a superconducting magnetoresistive element according to a first embodiment of the present invention. This superconducting magnetoresistive element is constituted from a plurality of superconducting portions 13a having a high critical current density and a plurality of weak-coupling portions 13b having a low critical current density, the superconducting portions 13a and the weak-coupling portions 13b being provided on a substrate 10 alternately.

Figure 2A:
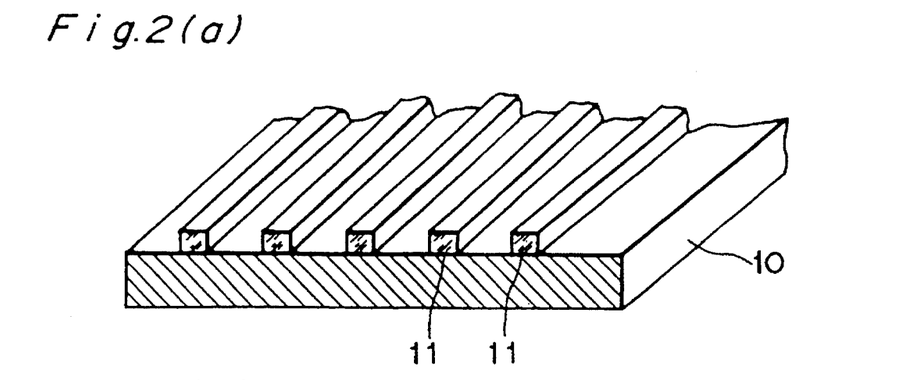
FIGS. 2(a)–2(c) are illustrations describing the process of fabricating the superconducting magnetoresistive element of FIG. 1, wherein a cross section of the superconducting magnetoresistive element in the process of fabrication taken along line II—II of FIG. 1 is seen.

The superconducting magnetoresistive element is fabricated through the following steps. First, a 1000 Å thick Si thin film 11 is deposited on an $SrTiO_3$ (100) substrate 10 by an electron beam deposition method and the Si thin film 11 is processed into a fine pattern of lines of a width of 1 μm and a line spacing of 5 μm by normal photolithography and dry etching, as shown in FIG. 2(a).

Figure 2B:
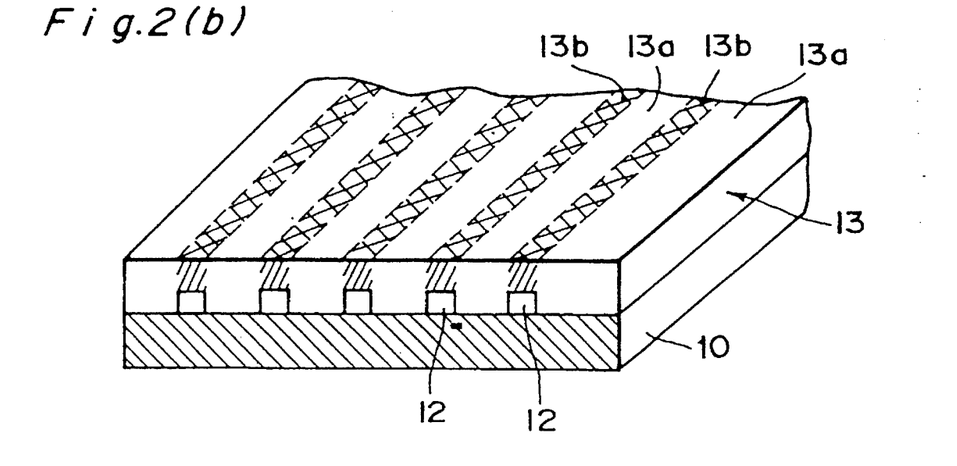

Next, the substrate 10 is placed in a chamber and a 1000 Å thick $Y_1Ba_2Cu_3O_{7-x}$ thin film (superconducting thin film) 13 is deposited on the substrate 10 by a reactive deposition method with the substrate temperature held at 650° C., as shown in FIG. 2(b), under such control that a composition ratio of Y:Ba:Cu=1:2:3 is attained. In this deposition process, in order to oxidize the superconducting thin film 13 to a sufficient extent, an oxygen gas containing 10% by weight of ozone is introduced into the vicinity of the substrate 10 and RF (radio frequency) plasma is generated. In this case, the degree of vacuum in the vicinity of a pump is $2 \times 10^{-4}$ Torr.

Then, while the substrate temperature is once lowered to 500° C. oxygen is introduced into the chamber so that the pressure becomes 300 Torr. This state is held for one hour to make the superconducting thin film 13 sufficiently oxidized. By so doing, an element Si is diffused (doped) from the Si thin film 11 into the superconducting thin film 13. Thereby the portions of the superconducting thin film 13 overlying the Si thin film 11 become the weak-coupling portions 13b and, meanwhile, the rest portions of the superconducting thin film 13 become the superconducting portions 13a. During the oxidization of the superconducting thin film 13, the patterned Si thin film 11 underlying the superconducting thin film 13 is simultaneously oxidized into a $SiO_2$ thin film 12 having an insulating property.

Figure 2C:
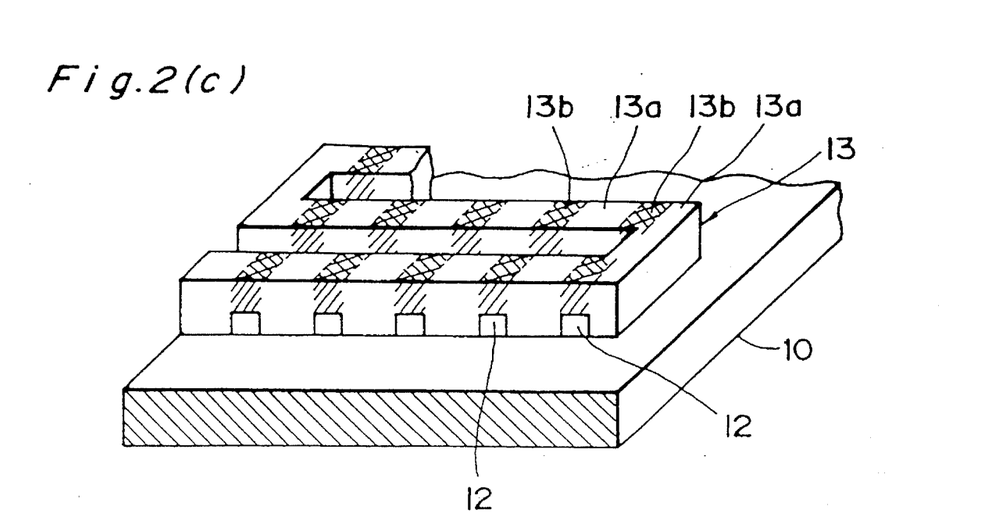

After naturally cooled, the substrate 10 is taken out of the chamber and subjected to photolithography and dry etching. Then, the superconducting thin film 13 is processed into a line pattern (meander pattern) having a line width of 5 μm and a line spacing of 5 μm, as shown in FIG. 2(c). As a result, the weak-coupling portions 13b with a width of 5 μm and a length of 1 μm are formed at regular intervals of 5 μm.

The X-ray diffraction and SEM (scanning electron microscope) observation proved that the portions (superconducting portions) 13a of the $Y_1Ba_2Cu_3O_{7-x}$ thin film 13 formed on the $SrTiO_3$(100) substrate 10 became perfect monocrystalline thin films containing no grain boundary regions. The critical temperature was 90° K., and the critical current density was $3 \times 10^6$ A/cm$^2$ (T=77° K.). Also, when a magnetic field was applied in a range up to 1000 G at a measured temperature of 77° K. and an applied current of 20 mA, there arose no broadening in the resistance-temperature characteristic due to the magnetic field.

On the other hand, the portions (weak-coupling portions) 13b of the $Y_1Ba_2Cu_3O_{7-x}$ thin film 13 formed on the Si thin films 11 proved to become a weak-coupling state, compared with the other portions (superconducting portions) 13a, on account of the diffusion of Si or $SiO_2$. These portions 13b had a critical temperature of 80° K. and a critical current density of $1 \times 10^3$ A/cm$^2$ (T=77° K.). Further, when a magnetic field was applied in a range up to as low as 100 G at a measured temperature of 77 K and an applied current of 20 mA, there appeared broadening of the resistance-temperature characteristic due to the magnetic field, proving that the superconductivity was broken even at a weak magnetic field.

Figure 3:
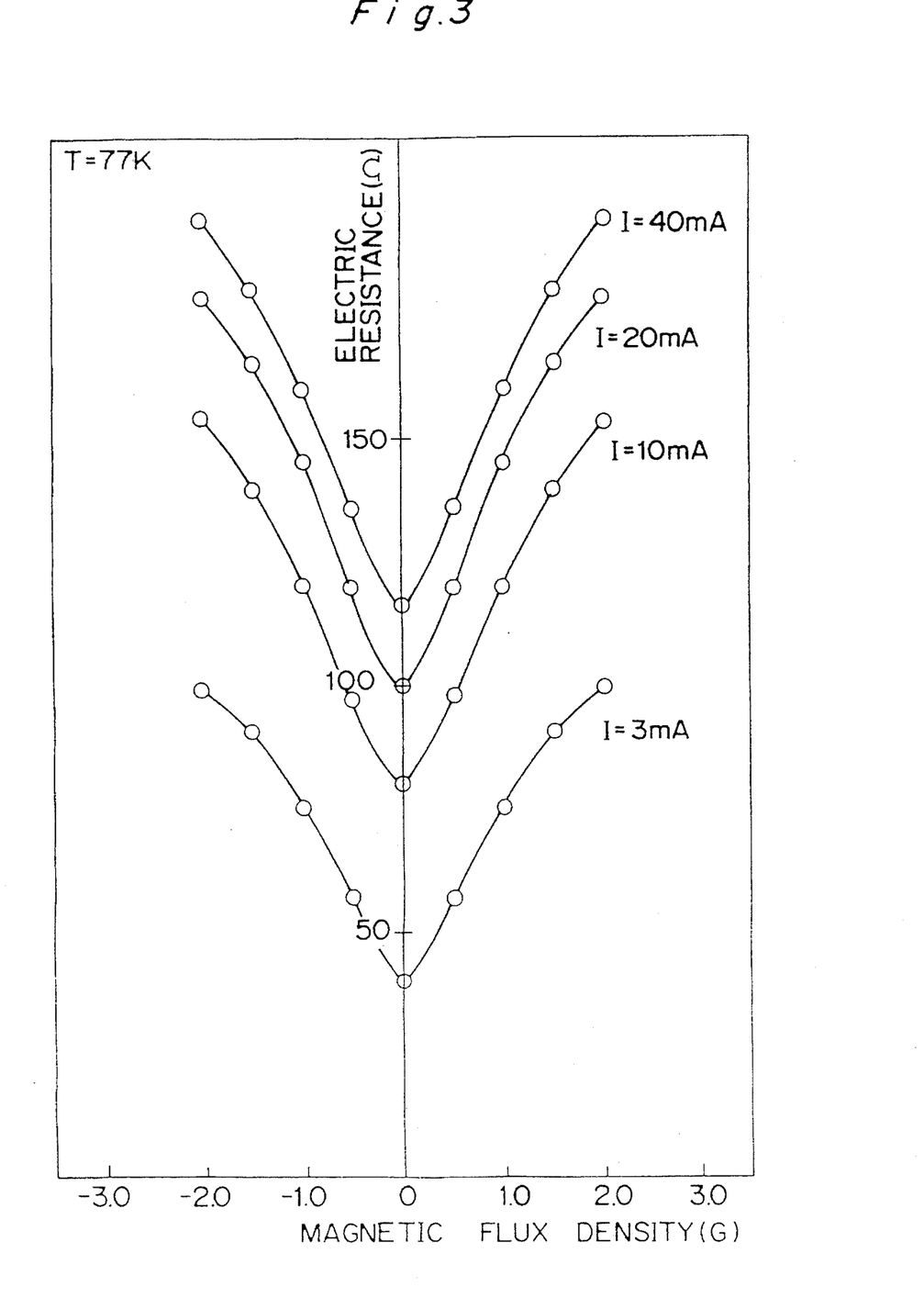
FIG. 3 is a graph showing a magnetoresistive characteristic of the superconducting magnetoresistive element of FIG. 1.

FIG. 3 shows the magnetoresistive (magnetic field to electric resistance) characteristic of the element. According to the measurement results of the magnetic sensitivity of the element, the magnetoelectric conversion ratio (signal) was 100 mV/gauss, noise characteristic (noise) 20 nV/√Hz [at 100 Hz], and magnetic detection sensitivity (S/N ratio) $2\times10^{-8}$ gauss/√Hz [at 100 Hz], at a measuring temperature of 77° K. and an applied current of 20 mA. It was found possible to enhance the S/N ratio to such an extent.

It should be noted that although the present embodiment employed $SrTiO_3(100)$ as the material of the substrate 11, others may be used such as $SrTiO_3(110)$, MgO(100), and YSZ(100) to attain similar results. Also, although this embodiment employed Si as the element to be doped to the superconducting thin film 13, others may be used such as Al and Fe to attain similar results.

Second Embodiment

Figure 4A:
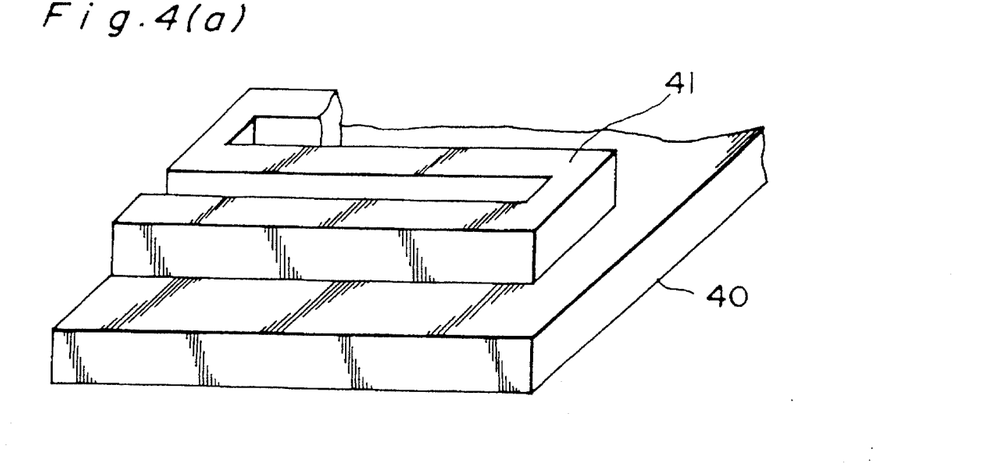
FIGS. 4(a)–4(c) are illustrations describing the process of fabricating a superconducting magnetoresistive element according to a second embodiment of the invention.
Figure 4B:
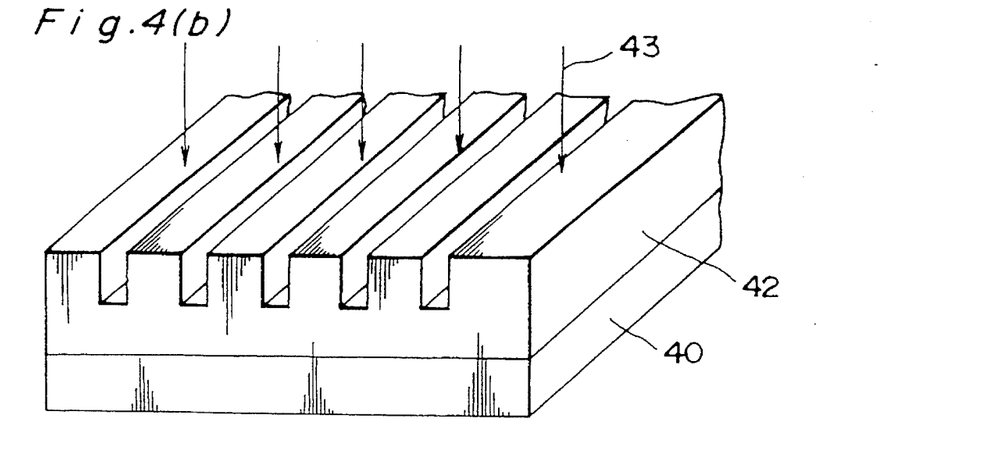
Figure 4C:
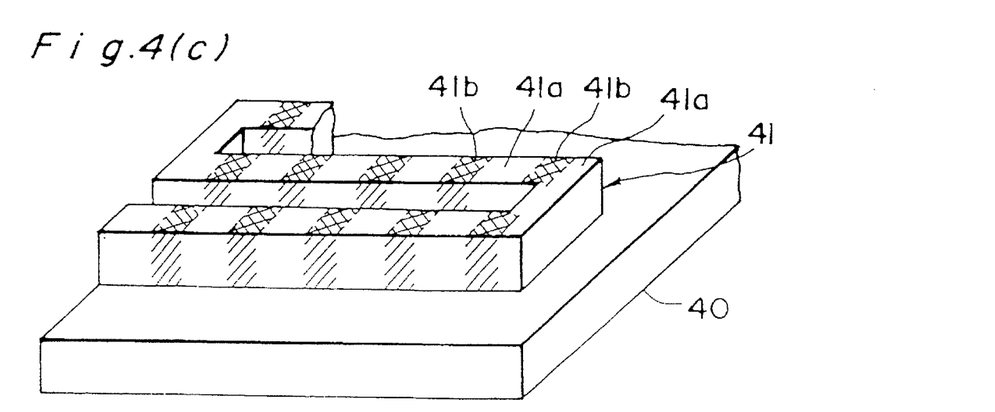

FIG. 4(a)–4(c) show the process for fabricating a superconducting magnetoresistive element according to a second embodiment of the invention. As shown in FIG. 4(a), a $Y_1Ba_2Cu_3O_{7-x}$ thin film (superconducting thin film) 41 is formed all over a $SrTiO_3(100)$ substrate 40 by a reactive deposition method, and processed into a meander pattern with a line width of 5 μm and a line spacing of 5 μm. Then, as shown in FIG. 4(b), photolithography is carried out to form a resist pattern 42 having a line width of 5 μm and a line spacing of 1 μm so that it crosses the superconducting thin film 41. Next the substrate 40 is placed in a chamber, and the substrate temperature is held at 200° C. In this state, nitrogen ions 43 are implanted (doped) in those portions of the superconducting thin film 41 that are not masked by the resist pattern 42, using an ion-beam gun. By so doing, the portions of the superconducting thin film 41 not masked by the resist pattern 42 are made to be weak-coupling portions 41b while the rest portions of the superconducting thin film 41 are made to be superconducting portions 41a. Thereafter, the resist pattern 42 is removed. As a result, as was the case with the first embodiment, there are formed the weak-coupling portions 41b of a width of 5 μm and a length of 1 μm at spacings of 5 μm. The measurement result of the superconducting magnetoresistive element of the second embodiment with respect to the magnetosensitivity (S/N ratio) was similar to that of the superconducting magnetoresistive element of the first embodiment described above.

It should be noted that although the second embodiment employed nitrogen as the material to be doped to the superconducting thin film 41, others may be used alternatively such as Ar, $H_2$, and $Cl_2$ to attain similar results.

In fabricating the superconducting magnetoresistive elements of the foregoing first and second embodiments, an element such as silicon or nitrogen was doped into the superconducting thin film 13 or 41 to provide the weak-coupling portions 13b or 41b. However, the weak-coupling portions can be provided also by utilizing the electrical anisotropy of a superconducting substance. In the crystal structure of $Y_1Ba_2Cu_3O_{7-x}$ and other like systems, the critical current density is about 100 times as great in the c-axis direction as in the a-b face. Therefore, by providing c-axis-oriented portions and a-axis-oriented portions alternately in a superconducting thin film of the same composition, there can be provided superconducting portions and weak-coupling portions alternately in series. The following description is directed to such examples.

Figure 5:
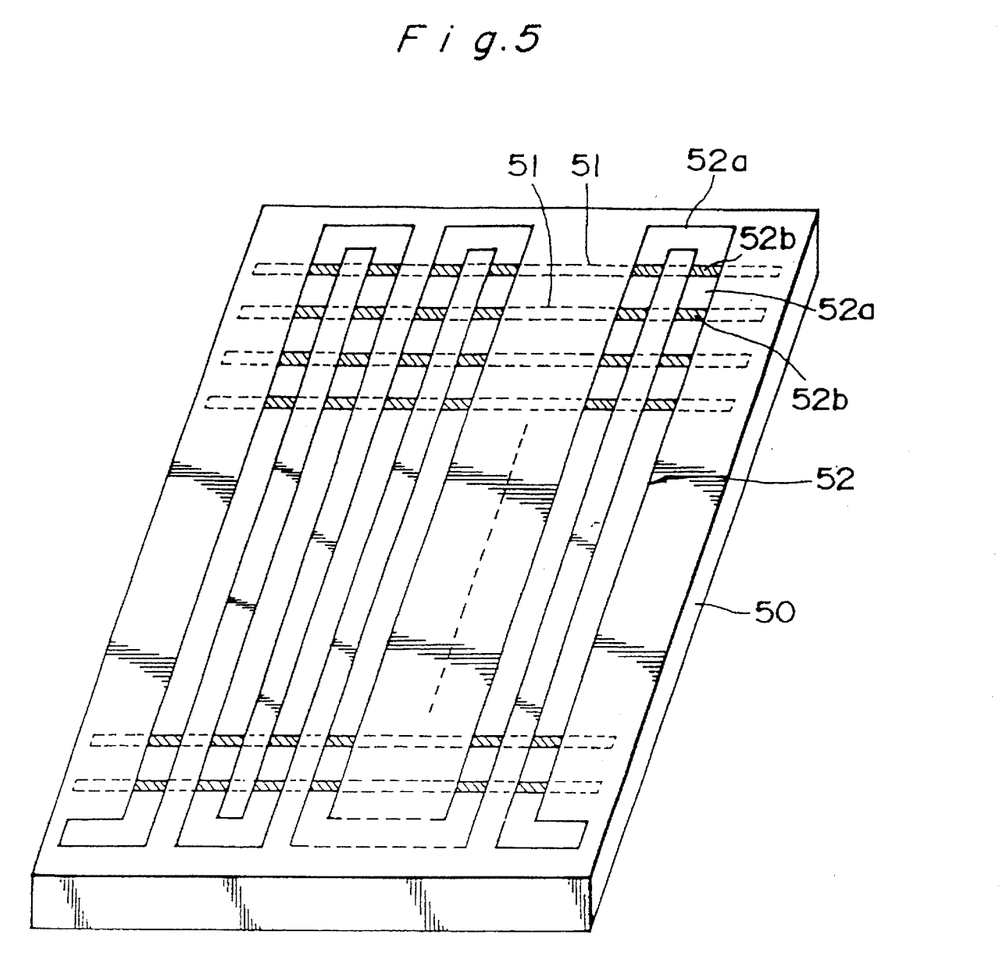
FIG. 5 is a schematic view showing the construction of a superconducting magnetoresistive element according to a third embodiment of the invention.

FIG. 5 shows the construction of a superconducting magnetoresistive element according to a third embodiment of the invention. To fabricate this superconducting magnetoresistive element, first a $LaSrGaO_4(100)$ thin film 51 is deposited on an $SrTiO_3(100)$ substrate 50 as a ground film, and patterned to lines of a width of 1 μm and a line spacing of 5 μm by photolithography and dry etching. Then, a $Y_1Ba_2Cu_3O_{7-x}$ thin film (superconducting thin film) 52 is deposited on the whole thin films 51 by the reactive deposition method, and subjected to photolithography and dry etching to be patterned into a meander shape which crosses the plurality of the $LaSrGaO_4(100)$ thin films 51. In doing this, portions 52b of the $Y_1Ba_2Cu_3O_{7-x}$ thin film 52 overlying the $LaSrGaO_4(100)$ thin films 51 are oriented along the a-axis while the other portions 52a of the $Y_1Ba_2Cu_3O_{7-x}$ thin film 52 overlying the $SrTiO_3(100)$ substrate between the $LaSrGaO_4(100)$ thin films 51 are oriented along the c-axis. As a result, the superconducting thin film 52 has superconducting portions 52a and weak-coupling portions 52b which are connected in series. By the above method, the weak-coupling portions 52b of a width of 5 μm and a length of 1 μm were formed at intervals of 5 μm, as was the case with the first and second embodiments. The measurement results of the element so obtained indicated that it had magnetosensitivity similar to those of the superconducting magnetoresistive elements of the first and second embodiments.

Fourth Embodiment

Figure 6:
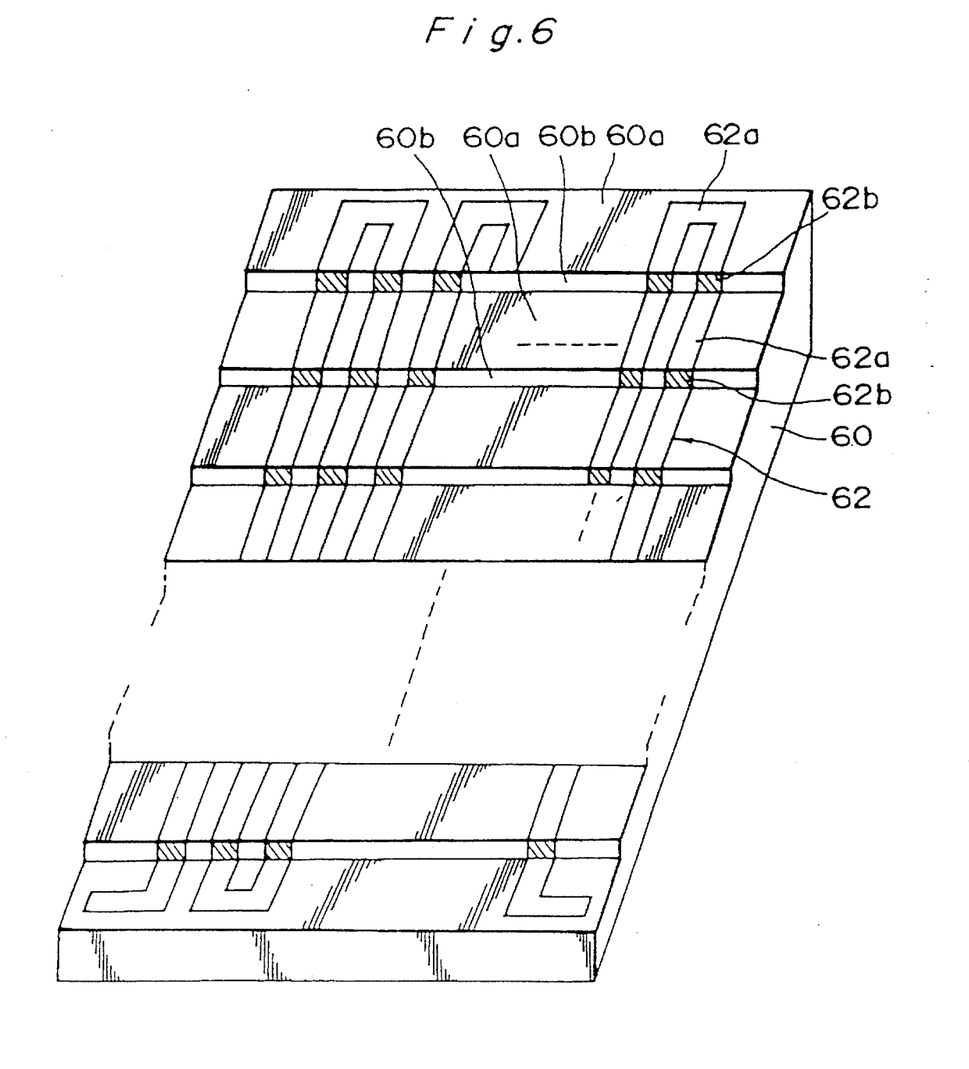
FIG. 6 is a schematic view showing the construction of a superconducting magnetoresistive element according to a fourth embodiment of the invention.

FIG. 6 shows the construction of a superconducting magnetoresistive element according to a fourth embodiment of the invention. In this embodiment, there is provided a meander-shaped superconducting thin film 62 on a staircase-shaped surface of a substrate 60. The staircase-shaped surface are formed of different crystal planes 60a and 60b, whereby the superconducting thin film 62 is provided with c-axis-oriented portions 62a and a-axis-oriented portions 62b. More specifically, an $SrTiO_3(100)$ substrate 60 deviated by 5° to 10° in the direction of [010] is used. As shown in FIG. 6, the staircase-like surface of the substrate 60 includes a plurality of (100) planes (i.e. first crystal planes) 60a and (010) planes (i.e. second crystal planes) 60b which are provided alternately. Onto the whole substrate surface, the $Y_1Ba_2Cu_3O_{7-x}$ thin film 62 is deposited by the reactive deposition method. According to the orientation of the substrate surface, portions of the $Y_1Ba_2Cu_3O_{7-x}$ thin film being in contact with the (010) faces 60b become a-axis oriented while the rest portions 62a of the $Y_1Ba_2Cu_3O_{7-x}$ thin film 62 become c-axis oriented. Next, by photolithography and dry etching, the superconducting thin film 62 is processed into a meander pattern the lines of which pass over or cross a plurality of stairs formed by the (100) faces 60a and the (010) faces 60b. By so doing, the superconducting thin film 62 is arranged into a state in which superconducting portions 62a and weak-coupling portions 62b are provided alternately in series. As was the case with the first to third embodiments, the weak-coupling portions 62b of a width of 5 μm and a length of 1 μm can be formed at intervals of 5 μm. The measurements of the element of this embodiment with respect to magnetosensitivity had similar results to those obtained in the first to third embodiments.

Although each of the foregoing embodiments employed a $Y_1Ba_2Cu_3O_{7-x}$ thin film as a superconducting thin film, it is needless to say that the invention is not limited to this composition. Other oxide superconducting substances may be used alternatively, such as $(La_{1-x}M_x)_2CuO_4$ (M=Ba, Sr, Ca), $Ln_1Ba_2Cu_3O_{7-x}$ (Ln=Nd, Pm, Sm, Eu, Gd, Dy, Ho, Er, Tm, Yb), $Bi_2Sr_2Ca_2Cu_3O_{10-x}$, $Bi_2Sr_2Ca_1Cu_2O_{10-x}$, $Bi_{1.7}Pb_{0.2}Sb_{0.1}Ca_{2.0}Sr_{2.0}Cu_{2.8}O_{10-x}$, $(Bi_{0.7}Pb_{0.3})_2Sr_2Ca_2$ $Cu_3O_{10-x}$, $Tl_2Ba_2Ca_2Cu_3O_{10-x}$, $Tl_2Ba_2Ca_1Cu_2O_{10-x}$, $Ba_{1-x}K_xBiO_3$, or $Nd_{2-x}Ce_xCuO_{4-y}$ ($0 \leq x \leq 1$, $0 \leq y \leq 1$).

Furthermore, in order to form a superconducting thin film onto a substrate, methods such as spattering, laser ablation, CVD, etc may be employed instead of the reactive deposition method.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a superconducting magnetoresistive apparatus which comprises a plurality of superconducting portions having such a high critical current density that the superconducting portions hold a zero resistance to any magnetic fields within a measuring range, said superconducting portions being spaced from each other, and a plurality of weak-coupling portions having a lower critical current density, each of which is positioned between the neighboring superconducting portions so that the superconducting portions and the weak-coupling portions are alternately arranged and connected in series, comprising the steps of:

forming either semiconductor films or metal films at a plurality of sites on a substrate in a manner that the semiconductor or metal films are spaced from each other;

forming a superconducting thin film all over said substrate and processing the superconducting thin film into a line pattern which passes over the plurality of semiconductor or metal films; and heat-treating the substrate to diffuse a constituent element of the semiconductor films or metal films in the superconducting thin film so that portions of the superconducting thin film overlying the semiconductor or metal films become the weak-coupling portions and that the rest portions of the superconducting thin film become the superconducting portions.

2. The method as claimed in claim 1, wherein the diffused element is one selected from Si, Al and Fe.

3. The method as claimed in claim 1, wherein the substrate is formed from a material selected from $SrTiO_3(100)$, $SrTiO_3(110)$, $MgO(100)$ and $YSZ(100)$.

4. A method of fabricating a superconducting magnetoresistive apparatus which comprises a plurality of superconducting portions having such a high critical current density that the superconducting portions hold a zero resistance to any magnetic fields within a measuring range, said superconducting portions being spaced from each other, and a plurality of weak-coupling portions having a lower critical current density, each of which is positioned between the neighboring superconducting portions so that the superconducting portions and the weak-coupling portions are alternately arranged and connected in series, comprising the steps of:

forming a superconducting thin film all over a substrate and processing the superconducting thin film into a line pattern;

forming a resist pattern on the substrate by photolithography so that the superconducting thin film of the line pattern is covered by the resist pattern at a plurality of sites spaced each other in a lengthwise direction of the superconducting thin film; and ion-implanting a specified element in the superconducting thin film using the resist pattern as a mask so that portions of the superconducting thin film not masked by the resist pattern become the weak-coupling portions and that the rest portions of the superconducting thin film masked by the resist pattern become the superconducting portions.

5. The method as claimed in claim 4, wherein the specified element is one selected from N, Ar, H, and Cl.

6. A method of fabricating a superconducting magnetoresistive apparatus which comprises a plurality of superconducting portions having such a high critical current density that the superconducting portions hold a zero resistance to any magnetic fields within a measuring range, said superconducting portions being spaced from each other, and a plurality of weak-coupling portions having a lower critical current density, each of which is positioned between the neighboring superconducting portions so that the superconducting portions and the weak-coupling portions are alternately arranged and connected in series, comprising the steps of:

forming ground films at a plurality of sites on a substrate surface in a manner that the ground films are spaced from each other, the ground films being capable of changing a crystal orientation of a superconducting thin film to be formed thereon; and forming the superconducting thin film all over the substrate and processing the superconducting thin film into a line pattern which passes over the plurality of ground films so that portions of the superconducting thin film overlying either the substrate or the ground films become the weak-coupling portions and that portions of the superconducting thin film other than the weak-coupling portions become the superconducting portions.

7. A method of fabricating a superconducting magnetoresistive apparatus which comprises a plurality of superconducting portions having such a high critical current density that the superconducting portions hold a zero resistance to any magnetic fields within a measuring range, said superconducting portions being space from each other, and a plurality of weak-coupling portions having a lower critical current density, each of which is positioned between the neighboring superconducting portions so that the superconducting portions and the weak-coupling portions are alternately arranged and connected in series, comprising the steps of:

preparing a substrate which has a staircase-shaped surface consisting of a plurality of first crystal planes and a plurality of second crystal planes intersecting and alternating with the first crystal planes, said second crystal planes beings capable of changing a crystal orientation of a superconducting thin film to be formed thereon;

forming the superconducting thin film all over the staircase-shaped surface of the substrate; and processing the superconducting thin film into a line pattern which passes over the plurality of second planes so that portions of the superconducting thin film being in contact with either the first crystal planes or the second crystal planes become the weak-coupling portions and that portions of the superconducting thin film other than the weak-coupling portions become the superconducting portions.

* * * * *